Jan. 21, 1958 D. H. LOONEY 2,820,932

CONTACT STRUCTURE

Filed March 7, 1956

INVENTOR
D. H. LOONEY
BY James W. Falk
ATTORNEY

United States Patent Office 2,820,932

Patented Jan. 21, 1958

2,820,932

CONTACT STRUCTURE

Duncan H. Looney, Summit, N. J., assignor to Bell Telephone Laboratories Incorporated, New York, N. Y., a corporation of New York Application March 7, 1956, Serial No. 570,009

7 Claims. (Cl. 317—240)

This invention relates to semiconductive devices and more particularly to contact elements suitable for integration by alloying to form conductive connections to semiconductive bodies and to methods for fabricating such contacts.

It is important in many types of semiconductive devices to make contact thereto in a manner which is advantageous both electrically and mechanically. This is particularly so in the case of certain silicon devices, such as disclosed in the application of G. L. Pearson, Serial No. 491,908, filed March 3, 1955, wherein the efficiency of the device hinges materially upon the electrical resistance of the contact. Hence, for such devices, an electrical contact combining good mechanical strength with negligibly small resistivity is extremely desirable. Similarly, the development of devices wherein a thin surface layer of one conductivity type is formed on a semiconductive body of opposite conductivity type, has presented new problems with regard to electrical connections to semiconductive surfaces. Such a body can be formed conveniently, for example, by vapor diffusion techniques of the kind described in application Serial No. 496,202, filed March 23, 1955, by G. C. Dacey, C. A. Lee and W. Shockley. A diffused surface layer can be made without difficulty to a very accurately controlled depth and resistivity when formed in accordance with those techniques. However, heretofore major problems have presented themselves in the fabrication of strong bonded connections to thin diffused heat-sensitive layers of semiconductive material. Particularly difficult has been the problem of forming low resistance alloyed connections to impurity-diffused layers which eventually are to serve as the base zones of junction transistors.

Prior methods of fabricating low resistance ohmic contacts to silicon and germanium semiconductors have been restricted to conventional alloying or soldering techniques, pressure contacts with all their drawbacks, or have employed plating processes of various kinds to provide thin coherent metallic films suitable for the soldering thereon of electrical leads. That such connections have not been entirely successful is not unexpected. The requirement that a connection be of negligible resistance eliminated, from consideration for possible use, a large number of materials and structural arrangements and made the problem particularly difficult. Prior methods of forming ohmic connections have usually sacrificed mechanical strength in order to use a material which adequately wets a particular semiconductive surface, or else have utilized extremely thin metallic films and then resorted to ordinary soldering techniques with the inherent heating problems associated with the fashioning of a strong bonded connection to a temperature-sensitive structure.

It is, therefore, an object of this invention to produce improved electrical contacts to semiconductive bodies.

Another object is to facilitate the production of low resistance ohmic connections to semiconductors.

A further object of the present invention is to fabricate an element for connection to a semi-conductive body by alloying to form a contact which is ohmic to either p- or n-type silicon or germanium.

Still further objects are to produce on semiconductive bodies strong electrical connections which are of low resistivity, which wet the semiconductive surface and form at relatively low processing temperatures highly coherent alloyed bonds which are soft, to allow for expansibility of the body and connection, and which are chemically inactive even at the high temperature operation of the device.

These and other objects of the invention are attained in accordance with aspects of this invention which are broadly directed to semiconductor contacts and methods of their fabrication which obviate the above and other disadvantages of the prior art. According to one aspect of the invention, a contact element suitable for connection with either n- or p-type silicon or germanium is fabricated by coating a conductive member with a metal which will dissolve silicon and germanium, then covering the solvent metal with a layer of a low melting point metal and subsequently coating this layer with a layer of the solvent metal. For example, the conductive element which is to be bonded to a semiconductive body advantageously can be formed by plating a Kovar or molybdenum member with a silver layer, a second layer which is lead, and a third layer which is again silver. The silver-lead-silver plated contact elements form very strong, essentially nonrectifying connections when bonded to silicon, germanium or silicon-germanium alloys at a temperature of 700° C. or below.

One feature of the invention resides in plating a conductive element which is to be fused to a semiconductive body with a soft, low melting point metal and a second metal which is a solvent for semiconductive material of the body.

In accordance with another feature of the present invention, an element for integration with a semiconductive body by alloying to form a conductive connection thereto is formed by depositing lead and silver upon any suitable conductive member.

In accordance with still another feature of the invention, Kovar and molybdenum members, upon which a layer of silver is bonded, are coated with a layer of lead which is thereafter covered with a layer of silver, and the conductive members connected by alloying to form an ohmic contact to the surface of a semiconductive body.

In accordance with a further feature of the present invention, a conductive element having a coating comprising an intermediate layer of a soft, low melting point metal sandwiched between layers of a semiconductor solvent metal, is placed upon a semiconductive body having thereon an impurity-diffused surface layer and the assembly is raised to an alloying temperature which is well below the temperature at which the diffused surface layer was formed.

The novel features which are believed to be characteristic of the invention, both as to its organization and method of operation, together with further objects and advantages thereof, will be understood more clearly and fully from the following description considered in conjunction with the accompanying drawing, in which.

Figure 1:
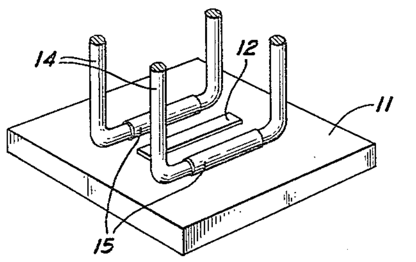
Fig. 1 illustrates a transistor including low resistance electrical connections constructed in accordance with this invention.

Referring to the drawing in detail, Fig. 1 shows a wafer 11 of semiconductive material having a thin, linear, evaporated emitter 12 bonded to its surface in the region between two low resistance ohmic contact elements 14, which have been fabricated and bonded to the surface of the semiconductive body in accordance with the invention. In this embodiment, U-shaped conductive members of, for example, Kovar or molybdenum wire with a 10 mil diameter have been covered over a restricted portion of their length with a metallic coating 15, and the contact elements attached by alloying to a semiconductive wafer which may be, for example, approximately ¼ cm. on an edge and about 5 to 10 mils thick.

The coating 15, according to the present invention, may be composed of silver and lead and is formed on at least a portion of the surface of a conductive member to a thickness which may be, for example, of the order of one mil. The underlying electrode material can be of any appropriate shape and may be formed from any suitable conductive material. Flat tabs of various dimensions, irregularly shaped pigtails and straight or bent wires have all been employed to advantage in this process. These conductive members are advantageously formed of materials such as molybdenum, tungsten, tantalum or Kovar which have thermal expansion coefficients which nearly match those of silicon and germanium. A particular advantage of the present invention lies in the fact that contact structures can thereby be formed and stockpiled in preparation for subsequent attachment to semiconductive bodies in one simple heating step. Further treatment of the contact is not required prior to alloyage. Since solders and fluxes are not employed, contamination problems are also reduced to a minimum by this process.

Figure 2:
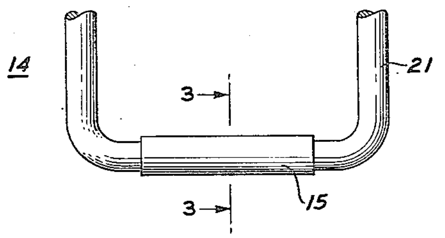
Fig. 2 shows a conductive member plated in accordance with this invention to provide an element for connection by alloying to a semiconductive device.

A typical contact structure prepared according to the present invention is shown in Fig. 2. The wire 21 which may be of the metals mentioned above, has been formed into a U-shape with a flattened base portion suitable for attachment to a semiconductive surface. This portion of the wire has been covered with the metallic coating 15 over a portion of its length which may approximate only ³⁄₆₄ of an inch.

Figure 3:
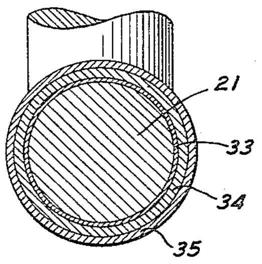
Fig. 3 is an enlarged cross section of a contact element fabricated in accordance with this invention.

Fig. 3 shows an enlarged cross section of the contact structure depicted in Fig. 2 and displays the discrete layer structure of the metallic coating which is applied to the conductive member. According to the present invention, this metallic coating is composed of two major constituents. One component must be a metal which will dissolve silicon and germanium to some appreciable extent. Silver is an example of a metal which is entirely suitable for this purpose. It shows silicon solubility greater than 5 atomic percent below 800° C. The second constituent advantageously can be a malleable, low melting point, metal which may be considered to be a diluent in the alloying process. Such a metal should melt below 1200° C. and above 200° C. It is desirable that it should have low volatility, for example, a boiling point greater than 1000° C., and that no compounds be formed by the diluent metal with semiconductor materials which have melting points above 1200° C. As an additional criteria, those metals which exhibit a Mohs' scale of hardness value, in the pure form, less than 3.0 are considered most desirable for utilization as diluent metals in this process. An example of a metal fulfilling the above requirement is lead.

Fig. 3 shows one particular structural arrangement of the two metals which can be employed to make up the metallic coating bonded to conductive member 21. The innermost layer 33 is of silver, bonded directly upon the conductive member, which may be, for example, a Kovar wire. This silver layer has been covered with a layer of lead 34 which is itself covered by a layer of silver 35, as the outermost layer.

In the following example, which will serve to illustrate one specific embodiment of the invention with greater particularity, a Kovar member made of 10 mil wire was used. This was first degreased and cleaned, for example, in hot solutions of carbon tetrachloride and hydrochloric acid respectively. After rinsing in water the wire was placed in a silver cyanide strike bath and plated at a current density of 1–2 amp./sq. ft. for 2 to 4 minutes, or until a grayish film began to appear. The wire was then electroplated in a silver cyanide bath at 5 amp./sq. ft. for 13 minutes. Next, the lead layer was plated on in a sulfanate lead plating bath at a rate of 15 amp./sq. ft. for 30 minutes. Following this the Kovar wire was again run in the silver strike bath at 1–2 amp./sq. ft. for 2–3 minutes and subsequently in the silver plating bath at 5 amp./sq. ft. for 4 minutes. This yielded a plating approximately 1 mil thick containing 20%–25% silver by weight. The plating observed under a microscope was smooth and fine grained.

Contact structures formed according to the plating processes discussed above were placed in a graphite jig and silicon wafers placed on top of them. The assembly was then heated in a furnace in the presence of forming gas (85% nitrogen, 15% hydrogen, ¹⁄₁₀–½% oxygen) to a temperature of 650°–700° C. Contacts bonded to silicon surfaces according to this method have been observed to form bonds stronger than the silicon wafers themselves. The plating formed a good fillet between the Kovar wire and the silicon surface, wetting was observed to be uniform and intimate bonding through alloyage occurred.

Contact elements of Kovar and molybdenum which have been plated with silver-lead-silver containing 20% to 25% silver have successfully been bonded to silicon surfaces over a range of bonding temperatures from 500° to 800° C. Above 800° C. the plating tends to flow off the conductive member excessively, thereby decreasing the strength of the bond between it and the plating. Below 500° C. a fillet still forms to some extent but it tends to be thin and the strength of the contact is lowered. Advantageously, contact elements coated with silver-lead-silver according to the invention, can be alloyed to a silicon surface at a temperature in the range of 650°–700° C. Excellent results have been obtained with germanium surfaces at 500° C. and temperature does not appear to be very critical.

The lead-silver alloy system as utilized by this invention offers many advantages in the formation of alloyed ohmic contacts to semiconductive bodies. Together with germanium or silicon it forms a system with a liquidus extending down to relatively low temperatures. Thus an appreciable amount of semiconductive material can be in the liquid phase at temperatures far below the melting point of the semiconductive material. Of considerable importance is the fact that good wetting to silicon or germanium takes place at a temperature below that at which appreciable solution of the semiconductor occurs. The result is that solution takes place uniformly over the entire alloyed area. Likewise, from the point of view of mechanical strength, serious straining of the semiconductive surface during the cooling which follows solidification of the metallic system is avoided by the use of a lead-silver plated-member connection. The yield strength of this solidified metallic system is high and, as well, the thermal expansion coefficient of the conductive member is made to nearly match that of the semiconductive body.

The particular bonding arrangement, silver, lead, and silver, respectively, has been found to offer extremely advantageous results in the fabrication of alloyed ohmic connections of the type described herein. It may be desirable to vapor deposit lead and silver upon the conductive member employed or in some instances to apply the silver-lead coating to the surface of the semiconductive material itself and then attach a conductive member by heat treatment. However, though close control of the various parameters involved is not essential in the practice of this invention, it has been found that the outer layer of silver results in more uniform wetting of a semiconductive surface. An inner layer of silver, also has been shown to give better results since it enables a stronger bond to be formed between the conductive member and the alloyed connection. Plated conductive members of Kovar and molybdenum, wherein the silver content of the silver-lead-silver coating is in the range of 10% to 40%, can be employed to fabricate excellent ohmic connections to both germanium and silicon. Particularly advantageous results have been obtained with 20%–25% silver plating.

The lead and silver electroplating baths utilized in the process described above were standard aqueous solution plating baths, employed at room temperature without agitation. For example, the silver plating can be done in a silver cyanide bath. Either a sulfanate or fluoborate lead bath has been found to be entirely suitable for application of the lead layer.

The silver-lead contact element of this invention has the notable advantage of being substantially ohmic when connected by alloyage to both n- and p-type samples of both silicon and germanium. Conventionally current can be passed in either direction through an ohmic contact to a semiconductor without changing the minority carrier density. Such a contact may be defined reasonably as one having a linear current-voltage characteristic. Since the current-valtage characteristic of the silver-lead contact is a straight line for either n- or p-type samples of either germanium or silicon, it is clear that the contact is essentially non-rectifying as well as low resistance.

A simple current-voltage characteristic for a contact conveys immediate information on contact resistance. This characteristic may be measured by simply utilizing a second contact so that the voltage from semiconductor to conductor can be observed. The method has the advantage that the resulting characteristic can be displayed readily on an oscilloscope and resistances of pairs of contacts fabricated according to the present invention were determined in such a manner.

Typically the semiconductive wafer is measured in size and resistivity and its body resistance calculated. A suitable silicon wafer may be, for example, approximately 6 mils thick and have a resistivity in the range of 2 to 7 ohm centimeters. The resistance of each contact was about 5 ohms. The area of the contacts being approximately $1.0 \times 10^{-2}$ square centimeters, it is seen that the contact resistance of such lead-silver connections is very low indeed.

Figure 4:
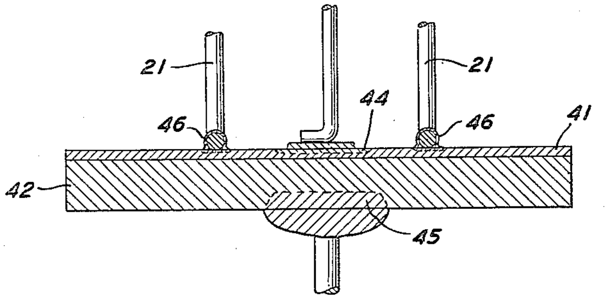
Fig. 4 is an enlarged sectioned elevation of a p-n-i-p junction transistor to which ohmic base connections have been made in accordance with this invention.

Fig. 4 shows in cross section a p-n-i-p junction transistor to which ohmic base connections have been made, in accordance with this invention.

As discussed fully in application Serial No. 496,202, to which reference has already been made, in the fabrication of junction transistors it has been found advantageous for increased control to form the base zone by diffusion techniques. To this end, a semiconductive body of one conductivity type is heated in the vapor of an appropriate conductivity type determining substance and a thin surface region of the body is changed to the opposite conductivity type by the diffusion therein of the substance. Subsequently a selected portion of the surface of this diffused region is reconverted to its original conductivity type. As a consequence there remains of the diffused region of opposite conductivity type a surface portion which is exposed and to which a base connection must subsequently be made and a portion which is intermediate the bulk of the body and the reconverted surface portion. This intermediate portion, which lies between the regions of the one conductivity type, serves as a base zone.

With particular reference to the fabrication of a typical design of germanium p-n-i-p unit of the kind shown in cross section in Fig. 4, an n-type diffused surface layer 41, a fraction of a mil in thickness, is formed on a monocrystalline germanium wafer 42 of substantially intrinsic conductivity. Thereafter, by suitable etching techniques, this n-type surface layer is removed from the germanium body except on that portion of the surface which forms the front face; i. e., the face to which the emitter zone is to be formed. A surface portion of the remaining n-type surface layer is then converted to p-type for forming the emitter zone 44 and, additionally, a surface portion of the back face of the intrinsic region is converted to p-type for forming the collector zone 45.

The two base contacts 21 are applied to the base zone in accordance with the present invention. These are, for example, Kovar wires which were previously coated over the portion of their length which is now in contact with the germanium surface with a silver-lead-silver plating. They are alloyed to the base zone at a temperature of 500° C., well below 900° to 1000° C., which is the temperature range at which the surface diffusion generally takes place. The alloyed bonds 46 between the contacts and the germanium surface are nonrectifying, extremely strong and of low resistance, and the processes employed lend themselves well to good reproducibility on a mass production scale.

It is to be understood that the above-described arrangements and techniques are but illustrative of the application of the principles of the invention. Thus the teaching of this invention is also applicable to the formation of ohmic, low resistance alloyed contacts to semiconductive intermetallic compounds, for example, of the type represented by indium arsenide, gallium arsenide, indium antimonide, zinc sulfide or cadmium sulfide. Numerous other arrangements and procedure may be devised by those skilled in the art without departing from the spirit and scope of the invention.

What is claimed is:

1. An element for integration with a silicon body by alloying to form a conductive connection thereto comprising a conductive member, a first silver layer bonded upon said member, a lead layer bonded to said silver layer, and a second layer of silver bonded to said lead layer.

2. An element for integration with a semiconductive body selected from the group consisting of silicon, germanium, and silicon-germanium alloys, by alloying to form a conductive connection thereto comprising a conductive member, a first silver layer bonded upon said member, a lead layer bonded to said silver layer, and a second layer of silver bonded to said lead layer.

3. The method of producing a low resistance alloyed connection to a silicon body comprising placing upon said body a coated conductive member having alternate discrete layers of lead and silver bonded thereupon and silver at the interface between the body and said coated member, heating the interfacial region between said silicon body and said coated member to a temperature above 500° C. and below 800° C., and cooling the assembled conductive member and body to room temperature.

4. The method of obtaining a low resistance ohmic connection between a conductive member and a semi-conductive body comprising the steps of coating the conductive member with an inner silver layer, an intermediate lead layer and an outer silver layer and forming an alloy between the silver and lead layers and a surface portion of the semiconductive body.

5. A device comprising a body of semiconductive material selected from the group consisting of silicon, germanium and silicon-germanium alloys, and an ohmic connection alloyed thereto, said connection comprising a metallic member having a coating comprising an inner silver layer, an intermediate lead layer and an outer silver layer, said lead and silver forming an alloy with said semiconductive material.

6. A device in accordance with claim 5 wherein said member is a metal having a thermal coefficient of expansion similar to that of said semiconductive material.

7. A device in accordance with claim 5 wherein said silver content is from substantially 20 to 25 percent.

References Cited in the file of this patent

UNITED STATES PATENTS 2,402,839 Ohl ------------------- June 25, 1946